United States Patent
Gershon et al.

(10) Patent No.: US 10,032,949 B2
(45) Date of Patent: Jul. 24, 2018

(54) PHOTOVOLTAIC DEVICE BASED ON AG$_2$ZNSN(S,SE)$_4$ ABSORBER

(71) Applicant: International Business Machines Corporation, Armonk, NY (US)

(72) Inventors: Talia S. Gershon, White Plains, NY (US); Supratik Guha, Chicago, IL (US); Oki Gunawan, Westwood, NJ (US); Richard A. Haight, Mahopac, NY (US); Yun Seog Lee, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 235 days.

(21) Appl. No.: 14/936,131

(22) Filed: Nov. 9, 2015

(65) Prior Publication Data

US 2017/0133539 A1    May 11, 2017

(51) Int. Cl.
| | |
|---|---|
| *H01L 31/18* | (2006.01) |
| *H01L 31/072* | (2012.01) |
| *H01L 31/032* | (2006.01) |
| *H01L 21/02* | (2006.01) |
| *H01L 31/0392* | (2006.01) |
| *H01L 31/07* | (2012.01) |

(52) U.S. Cl.
CPC ........ *H01L 31/072* (2013.01); *H01L 21/0256* (2013.01); *H01L 21/0262* (2013.01); *H01L 21/02557* (2013.01); *H01L 21/02568* (2013.01); *H01L 21/02579* (2013.01); *H01L 31/0326* (2013.01); *H01L 31/0327* (2013.01); *H01L 31/0392* (2013.01); *H01L 31/07* (2013.01)

(58) Field of Classification Search
CPC .......... H01L 31/072; H01L 31/022466; H01L 31/0327; H01L 31/1884; H01L 31/1864
See application file for complete search history.

(56) References Cited

U.S. PATENT DOCUMENTS

| | | | | |
|---|---|---|---|---|
| 8,546,176 | B2 * | 10/2013 | Lee ...................... | C23C 14/0623 438/95 |
| 8,642,884 | B2 * | 2/2014 | Mitzi .................. | H01L 31/0749 136/252 |

(Continued)

OTHER PUBLICATIONS

Mitzi et al., The path towards a high-performance solution-processed kesterite solar cell, Solar Energy Materials & Solar Cells, 95, 2011, pp. 1421-1436.*

(Continued)

*Primary Examiner* — Earl Taylor
(74) *Attorney, Agent, or Firm* — Vazken Alexanian; Michael J. Chang, LLC

(57) ABSTRACT

Photovoltaic devices based on an Ag$_2$ZnSn(S,Se)$_4$ (AZTSSe) absorber and techniques for formation thereof are provided. In one aspect, a method for forming a photovoltaic device includes the steps of: coating a substrate with a conductive layer; contacting the substrate with an Ag source, a Zn source, a Sn source, and at least one of a S source and a Se source under conditions sufficient to form an absorber layer on the conductive layer having Ag, Zn, Sn, and at least one of S and Se; and annealing the absorber layer. Methods of doping the AZTSSe are provided. A photovoltaic device is also provided.

17 Claims, 4 Drawing Sheets

(56) References Cited

U.S. PATENT DOCUMENTS

| | | | | |
|---|---|---|---|---|
| 9,028,723 | B2* | 5/2015 | Torimoto | B82Y 30/00 136/263 |
| 9,608,141 | B1* | 3/2017 | Gershon | H01L 31/022441 |
| 2012/0074361 | A1* | 3/2012 | Torimoto | B82Y 30/00 252/519.14 |
| 2012/0100663 | A1* | 4/2012 | Bojarczuk | H01L 31/0326 438/73 |
| 2012/0100664 | A1* | 4/2012 | Guha | H01L 21/02422 438/86 |
| 2013/0037111 | A1* | 2/2013 | Mitzi | H01L 31/0326 136/264 |
| 2015/0136216 | A1* | 5/2015 | Kurihara | H01L 31/0326 136/256 |
| 2017/0018666 | A1* | 1/2017 | Gershon | H01L 31/0326 |
| 2017/0110606 | A1* | 4/2017 | Gershon | H01L 31/0326 |
| 2017/0133539 | A1* | 5/2017 | Gershon | H01L 31/072 |
| 2017/0194518 | A1* | 7/2017 | Gershon | H01L 31/022441 |
| 2017/0278995 | A1* | 9/2017 | Haight | H01L 31/054 |

OTHER PUBLICATIONS

Mitzi et al., Prospects and performance limitations for Cu—Zn—Sn—S—Se photovoltaic technology, Philosophical Transactions of The Royal Society A, 371, 2013 pp. 1-22.*

Gershon et al., Compositional effects in Ag2ZnSnSe4 thin films and photovoltaic devices, Acta Materialia, 126, 2017, pp. 383-388.*

Yeh et al., Preparation of the Ag—Zn—Sn—S quaternary photoelectrodes using chemical bath deposition for photoelectrochemical applications, Thin Solid Films, 558, 2014, pp. 289-293.*

Chagarov et al., Ag2ZnSn(S,Se)4: A highly promising absorber for thin film photovoltaics, The Journal of Chemical Physics, 144, 2016, 12 pages.*

Gong et al., Crystallographic and optical properties of (Cu, Ag)2ZnSnS4 and (Cu, Ag)2ZnSnSe4 solid solutions, Physica Satus Solidi C, 12, No. 6, 2015, pp. 700-703.*

Sasamura et al., Solution-phase Synthesis of Stannite-type Ag2ZnSnS4 Nanoparticles for Application to Photoelectrode Materials, The Chemical Society of Japan, 41, 2012, pp. 1009-1011.*

Schumer et al., Pirquitasite, Ag2ZnSnS4, Inorganic Compounds, Acta Cryallograhica Section E69, 2013, 7 pages.*

K. Li et al., "Synthesis of multicomponent sulfide Ag2ZnSnS4 as an efficient photocatalyst for H2 production under visible light irradiation," RSC Advances, vol. 3, No. 1, 2013, pp. 253-258 (published Nov. 2012).

W. Gong et al., "Crystallographic and optical properties of (Cu, Ag)2ZnSnS4 and (Cu, Ag)2ZnSnSe4 solid solutions," Physica Status Solidi (c), Apr. 2015, pp. 700-703.

K. Wei et al., "Synthesis and Characterization of Nanostructured Stannite Cu2ZnSnSe4 and Ag2ZnSnSe4 for Thermoelectric Applications," ACS Applied Materials & Interfaces, vol. 7, No. 18, Apr. 2015, pp. 9752-9752.

H. Cui et al., "Improving Efficiency of Evaporated Cu2ZnSnS4 Thin Film Solar Cells by a Thin Ag Intermediate Layer between Absorber and Back Contact," International Journal of Photoenergy, Jan. 2015, 170507, 9 pages.

L.-Y. Yeh et al., "Preparation of the Ag—Zn—Sn—S quaternary photoelectrodes using chemical bath deposition for photoelectrochemical applications." Thin Solid Films, vol. 558, Feb. 2014, pp. 289-293.

W. Li et al., "The role of Ag in (Ag,Cu)2ZnSnS4 thin film for solar cell application," Journal of Alloys and Compounds, vol. 625, 2015, pp. 277-283 (published Nov. 2014).

Chen et al., "Defect physics of the kesterite thin-film solar cell absorber Cu2ZnSnS4," Applied Physics Letters 96, 021902 (Jan. 2010).

Fortunato et al., "Transparent Conducting Oxides for Photovoltaics," MRS Bulletin, vol. 32, pp. 242-247 (Mar. 2007).

Kim et al., "Nanoscale investigation of surface potential distribution of Cu2ZnSn(S,Se)4 thin films grown with additional NaF layers," Nano Convergence 2014, 1:27 (Oct. 2014).

* cited by examiner

PHOTOVOLTAIC DEVICE BASED ON AG$_2$ZNSN(S,SE)$_4$ ABSORBER

STATEMENT OF GOVERNMENT RIGHTS

This invention was made with Government support under Contract number DE-EE0006334 awarded by The Department of Energy. The Government has certain rights in this invention.

FIELD OF THE INVENTION

The present invention relates to photovoltaic devices, and more particularly, to photovoltaic devices based on an Ag$_2$ZnSn(S,Se)$_4$ absorber and techniques for formation thereof.

BACKGROUND OF THE INVENTION

CZTSSe (Cu$_2$ZnSn(S,Se)$_4$) has served as an attractive earth-abundant semiconductor for photovoltaic devices. CZTSSe materials, however, suffer from bulk defects which can negatively affect device properties. For instance, bulk defects can impact open-circuit voltage (Voc). In fact, Voc exhibited by CZTSSe devices is currently the major limiting factor in efficiency.

Therefore, active materials for photovoltaic device which do not suffer from bulk defects would be desirable.

SUMMARY OF THE INVENTION

The present invention provides photovoltaic devices based on an Ag$_2$ZnSn(S,Se)$_4$ absorber and techniques for formation thereof. In one aspect of the invention, a method for forming a photovoltaic device is provided. The method includes the steps of: coating a substrate with a conductive layer; contacting the substrate with an Ag source, a Zn source, a Sn source, and at least one of a S source and a Se source under conditions sufficient to form an absorber layer on the conductive layer having Ag, Zn, Sn, and at least one of S and Se; and annealing the absorber layer. A buffer layer (e.g., Cu$_2$O, NiO, ZnTe, AlP, MoO$_3$, CdTe, CuI, MoO$_2$, MoS$_2$, and/or MoSe$_2$) can be formed on the absorber layer, and a transparent front contact can be formed on the buffer layer.

In another aspect of the invention, a photovoltaic device is provided. The photovoltaic device includes: a substrate coated with a conductive layer; and an absorber layer on the conductive layer, wherein the absorber layer includes Ag, Zn, Sn, and at least one of S and Se. The photovoltaic device can further include a buffer layer (e.g., Cu$_2$O, NiO, ZnTe, AlP, MoO$_3$, CdTe, CuI, MoO$_2$, MoS$_2$, and/or MoSe$_2$) on the absorber layer and a transparent front contact on the buffer layer.

A more complete understanding of the present invention, as well as further features and advantages of the present invention, will be obtained by reference to the following detailed description and drawings.

DETAILED DESCRIPTION OF PREFERRED EMBODIMENTS

As provided above, a potential drawback for the use of CZTSSe materials as the active absorber layer material in photovoltaic devices is their propensity for bulk defects. Bulk defects in the absorber layer can lead to undesirable device properties, such as poor open circuit voltage (Voc) performance. Cu—Zn antisite formation has been identified as the major cause of the Voc deficit (via band tailing). For a discussion of Cu—Zn antisite formation see, for example, Chen et al., "Defect physics of the kesterite thin-film solar cell absorber Cu$_2$ZnSnS$_4$," Applied Physics Letters 96, 021902 (January 2010), the contents of which are incorporated by reference as if fully set forth herein. The term "CZTSSe," as used herein, refers to a kesterite material containing copper (Cu), zinc (Zn), tin (Sn), and at least one of sulfur (S) and selenium (Se). Mention may be also made herein to CIGSSe materials. The term "CIGSSe," as used herein, refers to a material containing copper (Cu), indium (In), gallium (Ga), and at least one of S and Se.

However, it has advantageously been found herein that the band tailing problem can be eliminated if one swaps out either Cu or Zn for a different 1+ or 2+ valence cation (respectively). For instance, in the following example, silver (Ag) is substituted for Cu to form Ag$_2$ZnSn(S,Se)$_4$ which is also abbreviated herein as AZTSSe. Thus, the term "AZTSSe," as used herein, refers to a kesterite material containing Ag, Zn, Sn, and at least one of S and Se.

The implementation of AZTSSe materials presents some notable challenges. For instance, AZTSSe films are found to be n-type (whereas conventional CZTSSe materials are p-type). Thus, one cannot simply form a standard junction with conventional CZTSSe or CIGSSe device stack materials such as cadmium sulfide (CdS). As will be described in detail below, some device reconfiguration is needed to implement AZTSSe absorber materials.

Figure 1:
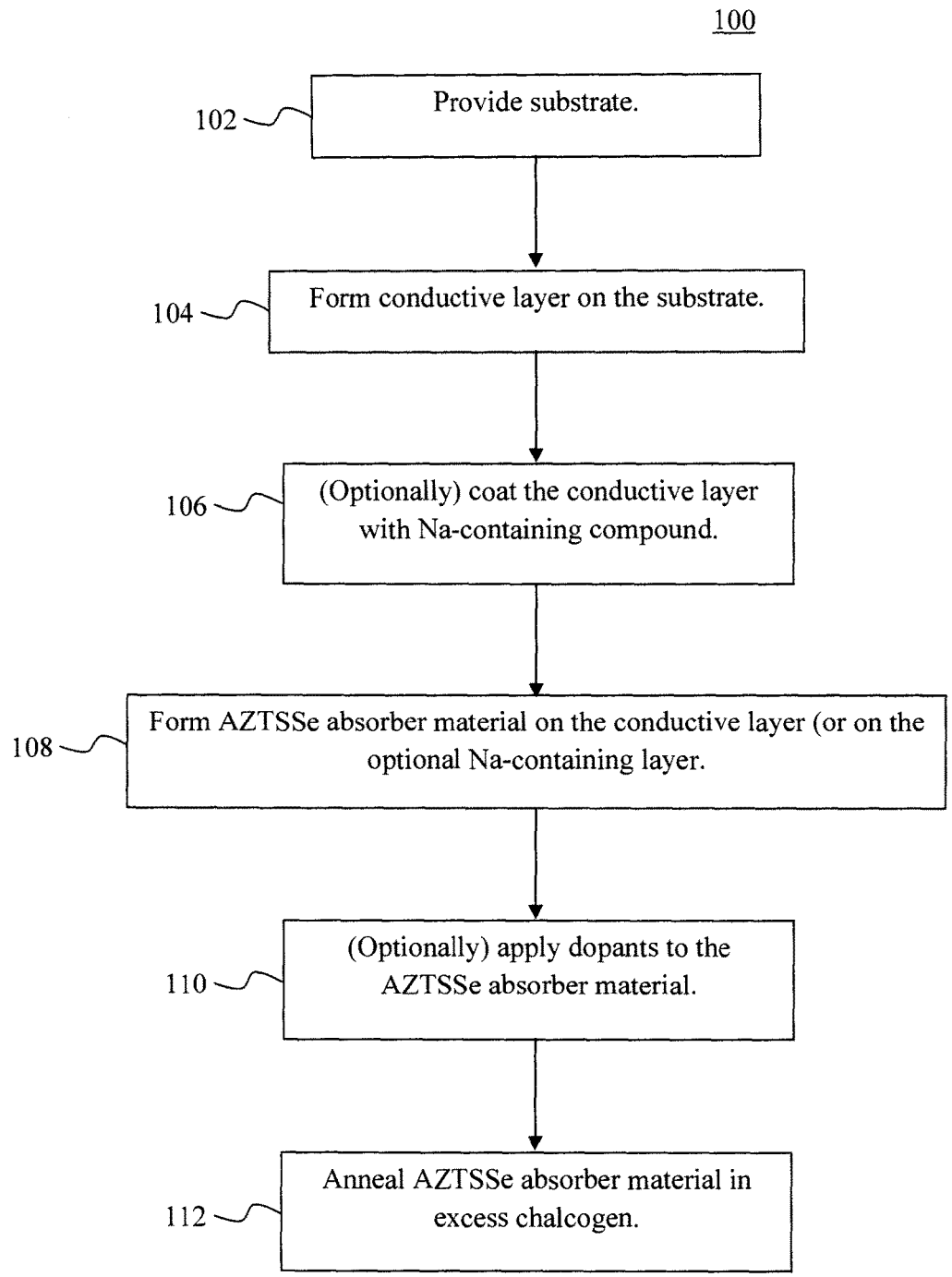
FIG. 1 is a diagram illustrating an exemplary methodology for forming an absorber material containing silver (Ag), zinc (Zn), tin (Sn), and at least one of sulfur (S) and selenium (Se) (i.e., AZTSSe) according to an embodiment of the present invention.

An overview of the present techniques is now provided by way of reference to methodology 100 of FIG. 1. In step 102, a starting substrate is provided. The substrate can vary depending on the particular application. For instance, in the example below, the present techniques will be implemented in the fabrication of a photovoltaic device. In that case, the substrate may be a glass, ceramic, metal foil, or plastic substrate.

When the substrate is formed from a non-electrically conductive material, it is preferable to coat the substrate with an (electrically) conductive material which will serve as an electrode of the device. Therefore, according to an exemplary embodiment, in step 104 a conductive layer is formed on the substrate. Suitable materials for forming the conductive layer include, but are not limited to, metal-containing materials, transparent conducting oxide, and combinations thereof. See, for example, Fortunato et al., "Transparent Conducting Oxides for Photovoltaics," MRS Bulletin, vol. 32, pgs. 242-247 (March 2007), the contents of which are incorporated by reference as if fully set forth herein.

The substrate (and conductive layer) is then preferably cleaned to remove any potential contaminants. Any standard cleaning process may be used, which can vary depending on the electrode material being used. For instance, an ammonium hydroxide ($NH_4OH$) clean is suitable for a metal-coated substrate, whereas a sulfuric acid and an inorganic oxidizer (such as NOCHROMIX® available from GODAX Laboratories, Inc., Cabin John, Md.) is preferable for transparent conducting oxides.

Optionally, in step 106 a sodium (Na)-containing layer can be formed on the substrate (coated with the conducting layer) prior to the AZTSSe. The placement of a thin layer of a Na compound, such as sodium fluoride (NaF), or sodium sulfide ($Na_2S$) or sodium selenide ($Na_2Se$), has been shown to enhance the electrical properties of kesterite absorber materials. Namely, Na from the layer gets incorporated in the absorber material during annealing. See, for example, Kim et al., "Nanoscale investigation of surface potential distribution of $Cu_2ZnSn(S,Se)_4$ thin films grown with additional NaF layers," Nano Convergence 2014, 1:27 (October 2014) (hereinafter "Kim"), the contents of which are incorporated by reference as if fully set forth herein (which describes how the resulting Na in the CZTSSe absorber layer serves to collect carriers and suppress their recombination near grain boundaries).

According to an exemplary embodiment, when present, the Na-containing layer is deposited onto the substrate to a thickness of from about 1 to about 100 nanometers (nm) and ranges therebetween. Suitable deposition techniques include, but are not limited to, evaporation, sputtering, spray coating, electrochemical plating, etc.

In step 108, an AZTSSe absorber layer is formed on the conductive layer (or on the optional Na-containing layer). According to an exemplary embodiment, the following process is used to form the AZTSSe absorber layer on the substrate. The substrate is placed on a hot plate in a vacuum chamber, and the substrate is heated to, and held at, a temperature of from about 100° C. to about 400° C., and ranges therebetween.

Thermal evaporation is then used to co-evaporate Ag, Zn, and Sn from their respective sources onto the conductive layer. Thermal evaporation generally involves heating and evaporation of a target source material (in this case Ag, Zn, and Sn and S or Se evaporation source materials) with a heating element (e.g., as in a Knudsen cell) to transform atoms from the anode into the gaseous phase (forming a source gas). When the source gas is contacted with the substrate, these atoms will precipitate on the substrate—forming a layer of the compound material on the conductive layer. According to an exemplary embodiment, a thermal cracking source is used for the S and Se, wherein the S and Se sources have two zones, one that heats the bulk source material to make it evaporate and another zone that cracks the material, e.g., from S8 to elemental S. This thermal cracking for the S and Se sources can be carried out using a commercially available thermal cracking cell.

The ratio of S to Se in the material (i.e., the S/(S+Se) or Se/(S+Se) ratio) of the material may be controlled by introducing the S and/or Se via one or more cracking cells. By regulating the S to Se ratio in the material, one can control the band gap. A suitable apparatus that may be employed in accordance with the present techniques to supply controlled amounts of S and/or Se during kesterite absorber film growth is described, for example, in U.S. Patent Application Publication Number 2012/0100663 by Bojarczuk et al., entitled "Fabrication of CuZnSn(S,Se) Thin Film Solar Cell with Valve Controlled S and Se" (hereinafter "U.S. Patent Application Publication Number 2012/0100663"), the contents of which are incorporated by reference as if fully set forth herein. In U.S. Patent Application Publication Number 2012/0100663 an apparatus is described which includes two separate cracking cells, one for S and the other for Se. Each cell is independently regulate-able in order to control the amounts of S and Se present during absorber formation. Thus, according to an exemplary embodiment, the S and Se source gas in the vapor chamber is introduced via one or more independently controllable cracking cells.

Via the above-described process, (gaseous) sources of Ag, Zn, Sn (e.g., by coevaporation), and at least one of S and Se (e.g., by cracking) are created in the vacuum chamber. When contacted with the substrate, atoms from theses sources will precipitate on the substrate forming the AZTSSe absorber. Suitable conditions for this AZTSSe deposition process include, but are not limited to, a temperature of from about 10° C. to about 450° C., and ranges therebetween, a duration of from about 1 minute to about 200 minutes, and ranges therebetween, and a vacuum chamber pressure of from about $1 \times 10^{-5}$ Torr to about $5 \times 10^{-10}$ Torr, and ranges therebetween.

As highlighted above, some challenges exist when trying to integrate the present AZTSSe materials with conventional CZTSSe or CIGSSe-compatible device materials—such as a CdS buffer layer. Advantageously, provided herein are unique device stack configurations which are directly compatible with the present AZTSSe absorber materials. For instance, as provided in detail below, a variety of different (p-type) materials have been identified for use a buffer layer in conjunction with the AZTSSe absorber.

It is also possible to dope the present AZTSSe materials, to optimize the carrier density or in some cases make them more compatible with traditional device materials or structures. For instance, incorporating indium (In) into the AZTSSe will make the material less n-type as determined from ultraviolet photoelectron spectroscopy (UPS), where the Fermi level is found to shift towards the valence band. Based on current understanding, it is thought that the III-valent In replaces the IV-valent Sn, resulting in p-type doping. By contrast, gallium (Ga) has been found to dope AZTSSe n-type (also determined via UPS). Based on current understanding it is postulated that III-valent Ga replaces II-valent Zn in the structure resulting in the n-type doping. It has also been found that incorporating halides, such as chlorine (Cl), fluorine (Fl), iodide (I) and/or bromide (Br) into the AZTSSe may alter the properties of the material.

Thus generally in step 110 dopants are optionally applied to the AZTSSe absorber material. For instance, a suitable group III metal (or combination of group III metals) can be deposited as a layer on the AZTSSe. By way of example only, evaporation can be used to deposit a layer of the group III dopant metal(s) on the AZTSSe to a thickness of from about 1 nanometer (nm) to about 10 nm, and ranges therebetween. The dopant will become incorporated into the AZTSSe during the subsequent anneal. In the case of a halide(s), evaporation may be used to deposit a layer of a compound containing the respective halide(s) on the AZTSSe. By way of example only, zinc chloride ($ZnCl_2$), zinc fluoride ($ZnF_2$), zinc iodide ($ZnI_2$), and zinc bromide ($ZnBr_2$) are suitable Cl, Fl, I, Br, source compounds. These halide dopants may become incorporated into the AZTSSe during the subsequent anneal. Halide dopants can also be introduced into the AZTSSe by soaking the substrate/AZTSSe in a solution containing the halide source compound (such as $ZnCl_2$) dissolved in a solvent such as methanol, or spraying the $ZnCl_2$ solution in methanol onto the AZTSSe film. The solution can be dried on the device structure using, e.g., an inert gas such as nitrogen ($N_2$) gas. The halide will, in the same manner as described above, become incorporated into the AZTSSe during the anneal. It is noted that n-type AZTSSe requires a new and optimized device stack (bottom electrode, buffer, etc). This is true for AZTSSe as well as n-doped AZTSSe (where, e.g., Ga is incorporated into the AZTSSe). The inversion of the AZTSSe layer to p-type (e.g., by the incorporation of p-type dopants such as In) will allow for the preparation of AZTSSe photovoltaic devices with a standard device structure (i.e., a Mo bottom electrode, a CdS buffer, etc).

It is notable that the preparation does not have to follow the same exact sequence of steps as depicted in FIG. 1. Methodology 100 is provided merely as an example to illustrate the present techniques. Thus, for example, the above-described Na-containing and/or group III/halide doping layers can be provided in any order with respect to the AZTSSe layer.

In step 112, the AZTSSe is then annealed. Annealing serves to improve the crystal grain structure as well as the defect structure, and in some cases may be necessary to form a material having a kesterite structure. The annealing performed in step 110 also serves to diffuse (and thereby incorporate) the (optional) Na and/or group III/halide dopants into the AZTSSe material (see above). According to an exemplary embodiment, the annealing is carried out at a temperature of from about 430° C. to about 550° C., and ranges therebetween, for a duration of from about 20 seconds to about 10 minutes, and ranges therebetween.

Preferably, the annealing is performed in an environment containing excess chalcogen, e.g., excess S and/or Se. See, for example, U.S. Pat. No. 8,642,884 issued to Mitzi et al., entitled "Heat Treatment Process and Photovoltaic Device Based on Said Process," the contents of which are incorporated by reference as if fully set forth herein (wherein a sulfurization or selenization heat treatment process is used to passivate the layers and interfaces in the device).

Figure 2:
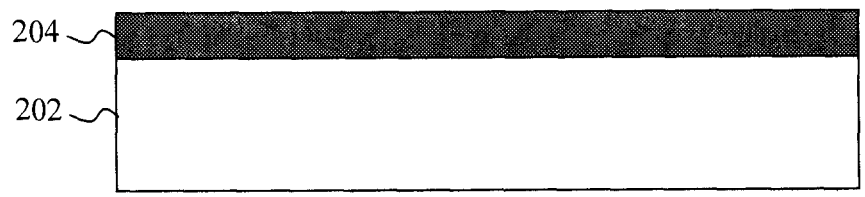
FIG. 2 is a cross-sectional diagram illustrating a starting platform for forming an AZTSSe-based photovoltaic device, including a substrate covered with a conductive layer according to an embodiment of the present invention.

The present AZTSSe materials can be used in a variety of different applications. For instance, in the following example, a photovoltaic device is formed with AZTSSe as the absorber material. As shown in FIG. 2, the process begins (as in the description of step 102, above) with a substrate 202. As described in conjunction with the description of step 104, above, the substrate 202 is coated with a conductive layer 204. The conductive layer 204 serves as a bottom electrode of the photovoltaic device. As provided above, suitable substrates include, but are not limited to, glass, ceramic, metal foil, or plastic substrates, and suitable materials for forming conductive layer 204 include, but are not limited to, metal-containing materials and/or transparent conducting oxides. According to an exemplary embodiment, the conductive layer 204 is formed on the substrate 202 using evaporation or sputtering to a thickness of from about 0.1 micrometers (μm) to about 3.0 μm, and ranges therebetween.

As described above, the substrate 202 is preferably cleaned before forming the conductive layer 204 and/or before forming the AZTSSe absorber. This cleaning serves to remove potential contaminants from the substrate surface. Suitable cleaning procedures were provided above.

Figure 3:
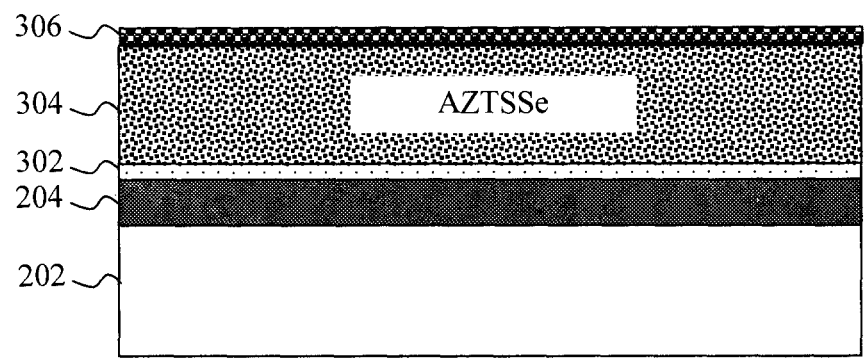
FIG. 3 is a cross-sectional diagram illustrating a thin Na-containing layer having been formed on the conductive layer, an AZTSSe layer having been formed on the Na-containing layer, and a dopant layer having been formed on the AZTSSe layer according to an embodiment of the present invention.

Optionally, as described in conjunction with the description of step 106 above, one may next coat the conductive layer 204 with a thin Na-containing layer (e.g., an NaF, $Na_2S$, or $Na_2Se$ layer) 302. See FIG. 3. During annealing, Na from this layer will become incorporated into the AZTSSe absorber and improve the electrical properties of the material—e.g., by suppressing carrier recombination near grain boundaries.

Next, as described in conjunction with the description of step 108 above, an AZTSSe layer 304 is formed on the conductive layer 204 (or on the optional Na-containing layer 302). The details for depositing the AZTSSe layer components via coevaporation (e.g., Ag, Zn, and Sn) and cracking (S and/or Se) were provided above. During the final anneal (performed as described below) Na from layer 302, if present, and/or any other (metal/halide) dopants (see below) will become incorporated into the AZTSSe layer.

Regarding dopants, as described in conjunction with the description of step 110 above, one or more optional metal (group III) and/or halide dopants may be used to configure the electrical properties of the absorber material. To introduce these dopants, a layer of the group III metal or metals and/or a layer/dip-coating of a halide-containing compound may be formed on the AZTSSe layer in the manner described above. The introduction of this doping is represented generically by layer 306 in FIG. 3. Alternatively, the dopant could be incorporated into the AZTSSe by co-evaporating it along with Ag, Zn, Sn, and S/Se during the formation of the absorber layer.

Figure 4:
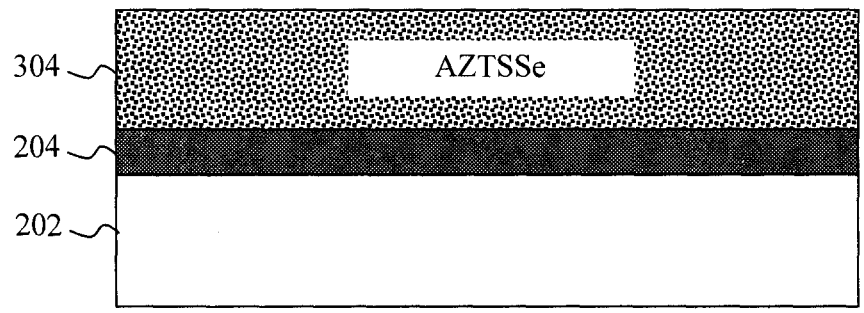
FIG. 4 is a cross-sectional diagram illustrating a recrystallization anneal of the AZTSSe layer having been performed which also serves to incorporate Na or any other dopants, if present, into to any of the AZTSSe layer according to an embodiment of the present invention.

As described in conjunction with the description of step 112 above, an anneal is performed to improve the crystal grain structure as well as the defect structure of the AZTSSe. As shown in FIG. 4, the anneal also serves to diffuse/incorporate the optional Na and/or metal/halide dopants into AZTSSe layer 304, i.e., as shown illustrated in FIG. 4 little if any of Na-containing layer 302 and/or doping layer 306 remain post-anneal.

Figure 5:
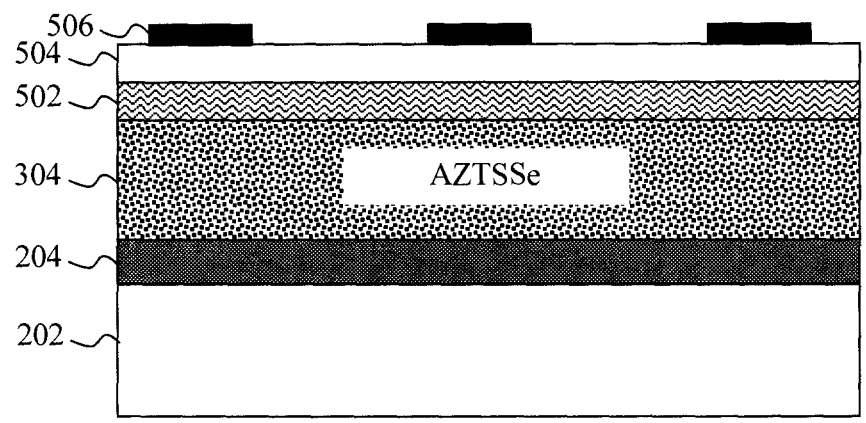
FIG. 5 is a cross-sectional diagram illustrating a buffer layer having been formed on the AZTSSe layer, a transparent front contact having been formed on the buffer layer, and metal contacts having been formed on the transparent front contact according to an embodiment of the present invention.
Figure 6:
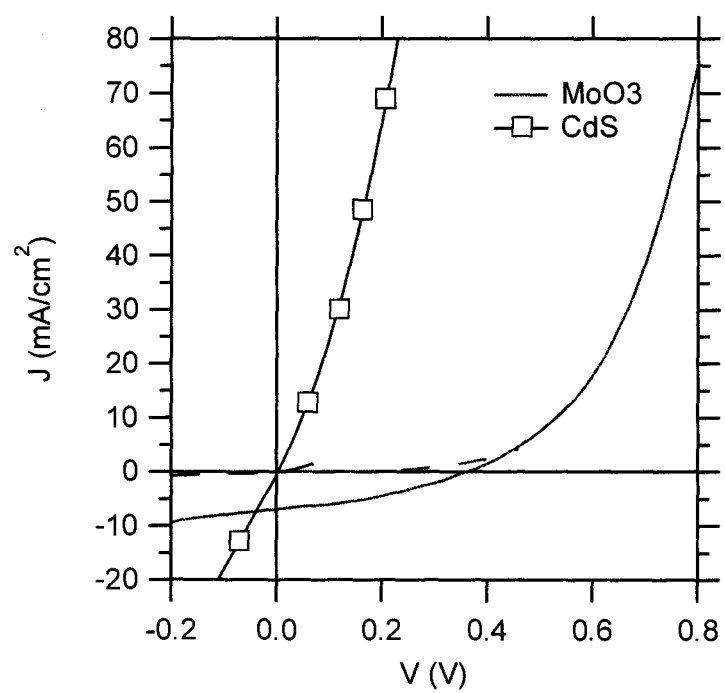
FIG. 6 is a plot illustrating electrical characteristics of an AZTSSe photovoltaic device using a molybdenum trioxide (MoO$_3$) buffer layer as compared to a traditional cadmium sulfide (CdS) buffer layer according to an embodiment of the present invention.

A buffer layer 502 is then formed on the AZTSSe layer 304. See FIG. 5. As provided above, the present AZTSSe is inherently n-type. Thus, traditional device stacks (e.g., those using cadmium sulfide (CdS) as the buffer material) might not be viable. However, it has been advantageously found herein that alternative buffer materials may be used in conjunction with the present AZTSSe-based absorber to form high-work function Schottky contacts or p-type buffer layers. By way of example only, the following have been found to be viable buffer materials for the present AZTSSe absorber: copper(I) oxide ($Cu_2O$), nickel(II) oxide (NiO), zinc telluride (ZnTe), aluminum phosphide (AlP), molybdenum trioxide ($MoO_3$), cadmium telluride (CdTe), copper (I) iodide (CuI), molybdenum(IV) oxide ($MoO_2$), molybdenum disulfide ($MoS_2$), molybdenum diselenide ($MoSe_2$), and combinations thereof. For instance, referring briefly to FIG. 6, the electrical characteristics of an AZTSSe photovoltaic device having a MoO$_3$ buffer layer is compared with an AZTSSe/CdS device stack. As shown in FIG. 6, the device with an MoO$_3$ buffer layer has a open circuit voltage (Voc) of 360 millivolts (mV), a short circuit current (Jsc) of about 7 milliamps per square centimeter (mA/cm$^2$), while the AZTSSe/CdS did not produce power at any appreciable levels. However, as provided above, doping can be used to modify the carrier concentration to make the present AZTSSe material compatible with conventional device materials, such as CdS.

A transparent front contact 504 is next formed on the buffer layer 502. Suitable materials for forming the transparent front contact include, but are not limited to, a transparent conductive oxide (TCO) such as indium-tin-oxide (ITO) and/or aluminum (Al)-doped zinc oxide (ZnO) (AZO)). By way of example only, the transparent front contact 504 can be formed on the buffer layer 502 using sputtering.

Metal contacts 506 may also be formed on the transparent front contact 504. See FIG. 5. According to an exemplary embodiment, the metal contacts 506 are formed from aluminum (Al) and/or nickel (Ni). The metal contacts 506 may be formed on the transparent front contact 504 using a process such as electron-beam evaporation.

Figure 7:
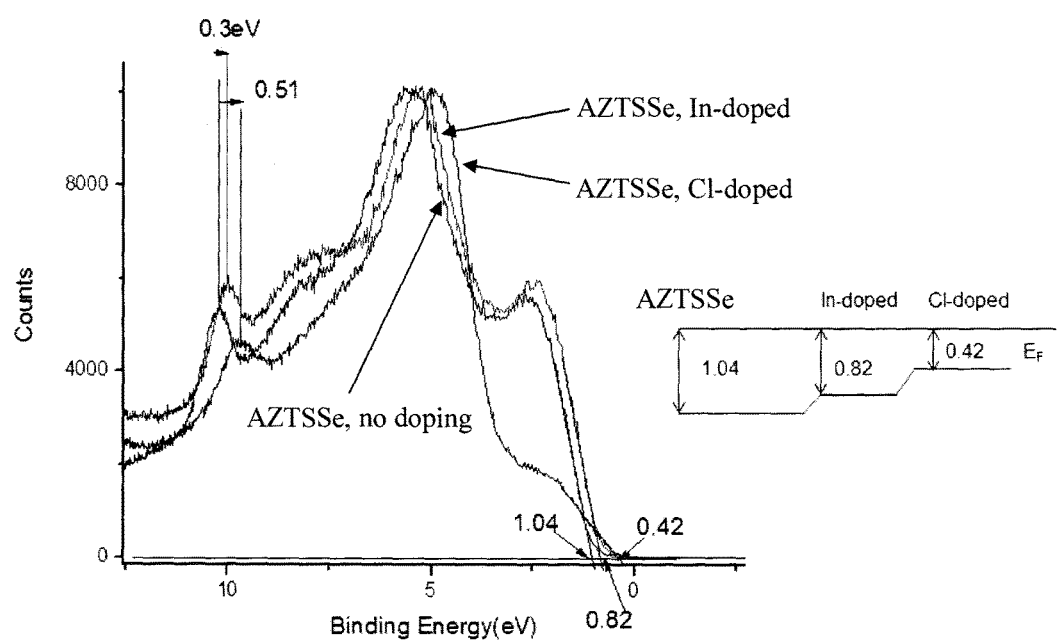
FIG. 7 is a plot illustrating doping of AZTSSe-absorber samples to shift the Fermi level according to an embodiment of the present invention.

As described in detail above, doping of the AZTSSe absorber may be used to modify the carrier concentration and thereby move the Fermi level. See, for example, FIG. 7 which depicts the Fermi level shift in group III or halide (e.g., In3+- and Cl-) doped AZTSSe films, as compared to an undoped sample. The shift in Fermi level indicates a change in carrier concentration of the material and (in the case of Cl) a shift in majority carrier type.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming a photovoltaic device, the method comprising the steps of:
   coating a substrate with a conductive layer;
   contacting the substrate with an Ag source, a Zn source, a Sn source, and at least one of a S source and a Se source under conditions sufficient to form an absorber layer on the conductive layer comprising Ag, Zn, Sn, and at least one of S and Se; and
   annealing the absorber layer,
   wherein the method further comprises the step of:
   forming a Na-containing layer on the substrate prior to performing the contacting step.

2. The method of claim 1, wherein the conditions comprise: a temperature, a duration, and a pressure.

3. The method of claim 2, wherein the temperature is from about 10° C. to about 450° C., and ranges therebetween.

4. The method of claim 2, wherein the duration is from about 1 minute to about 200 minutes, and ranges therebetween.

5. The method of claim 2, wherein the pressure is from about $1 \times 10^{-5}$ Torr to about $5 \times 10^{-10}$ Torr, and ranges therebetween.

6. The method of claim 1, wherein the substrate comprises a glass, a ceramic, a metal foil, or a plastic substrate.

7. The method of claim 1, wherein the conductive layer comprises a material selected from the group consisting of: a metal-containing material, a transparent conducting oxide, and combinations thereof.

8. The method of claim 1, further comprising the step of:
   coevaporating the Ag source, the Zn source, the Sn source, and the at least one of the S source and the Se source.

9. The method of claim 1, further comprising the step of:
   producing a regulated amount of the S source and the Se source using a S cracking cell and an Se cracking cell.

10. The method of claim 1, wherein the Na-containing layer comprises NaF, Na$_2$S or Na$_2$Se.

11. The method of claim 1, further comprising the step of:
    doping the absorber layer.

12. The method of claim 11, wherein the absorber layer is doped with a metal selected from the group consisting of: In, Ga, and combinations thereof.

13. The method of claim 12, wherein the absorber layer is doped with a halide selected from the group consisting of: Cl, Fl, I, Br, and combinations thereof.

14. The method of claim 1, wherein the annealing is performed at a temperature of from about 430° C. to about 550° C., and ranges therebetween.

15. The method of claim 1, further comprising the step of:
    forming a buffer layer on the absorber layer.

16. The method of claim 15, wherein the buffer layer comprises a material selected from the group consisting of: Cu$_2$O, NiO, ZnTe, AlP, CdTe, CuI, MoO$_3$, MoO$_2$, MoS$_2$, MoSe$_2$, and combinations thereof.

17. The method of claim 15, further comprising the step of:
    forming a transparent front contact on the buffer layer.

* * * * *